United States Patent
Ma et al.

(10) Patent No.: US 6,207,589 B1
(45) Date of Patent: Mar. 27, 2001

(54) METHOD OF FORMING A DOPED METAL OXIDE DIELECTRIC FILM

(75) Inventors: Yanjun Ma, Vancouver; Yoshi Ono, Camas, both of WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/515,743

(22) Filed: Feb. 29, 2000

Related U.S. Application Data

(62) Division of application No. 09/356,470, filed on Jul. 19, 1999, now Pat. No. 6,060,755.

(51) Int. Cl.$^7$ .................................................. H01L 21/31
(52) U.S. Cl. ........................ 438/785; 438/783; 438/784; 438/778
(58) Field of Search .................................. 438/778, 783, 438/784, 785

(56) References Cited

U.S. PATENT DOCUMENTS

| | | | |
|---|---|---|---|
| 4,520,413 | * | 5/1985 | Piotrowski et al. ................. 360/113 |
| 5,930,611 | * | 7/1999 | Okamoto ............................... 438/197 |
| 6,033,919 | * | 3/2000 | Gnade et al. ............................. 438/3 |
| 6,054,331 | * | 4/2000 | Woo et al. ................................ 438/3 |
| 6,060,391 | * | 5/2000 | Tatsumi ................................. 438/680 |
| 6,069,070 | * | 5/2000 | Labunov et al. ..................... 438/635 |

\* cited by examiner

*Primary Examiner*—Eddie C. Lee
*Assistant Examiner*—N. Drew Richards
(74) *Attorney, Agent, or Firm*—David C. Ripma; Matthew D. Rabdau; Scott C. Krieger

(57) ABSTRACT

A high-k dielectric film is provided which remains amorphous at relatively high annealing temperatures. The high-k dielectric film is a metal oxide of either Zr or Hf, doped with a trivalent metal, such as Al. Because the film resists the formation of a crystalline structure, interfaces to adjacent films have fewer irregularities. When used as a gate dielectric, the film can be made thin to support smaller transistor geometries, while the surface of the channel region can be made smooth to support high electron mobility. Also provided are CVD, sputtering, and evaporation deposition methods for the above-mentioned, trivalent metal doped high dielectric films.

17 Claims, 7 Drawing Sheets

I-V CURVES OF AS DEPOSITED AND ANNEALED
($500\,°C$ 30s $O_2$) Zr-Al-O FILMS

HIGH FREQUENCY (1 MHz) CV CHARACTERISTICS OF 3-7.5nm Zr-Al-O FILMS ON P-TYPE SUBSTRATE. POST DEPOSITION ANNEALS WERE DONE AT 400° C

EFFECTIVE DIELECTRIC CONSTANT AS A FUNCTION OF Zr-Al-O FILM THICKNESS

ACCUMULATION IV CHARACTERISTICS OF THE Zr-Al-O

TEMPERATURE DEPENDENCE OF LEAKAGE CURRENT FOR Zr-Al-O FILMS ON n- (@1.5V) AND P-TYPE (@-1.5V) SUBSTRATE

DISTRIBUTION OF TDDB MEASUREMENT RESULTS ON A 4.5nm Zr-Al-O FILM. THE STRESS VOLTAGES ARE LISTED IN THE INSERT

EXTRAPOLATION OF TDDB MEAN TIME TO FAIL AS A FUNCTION OF GATE VOLTAGE. A MEAN LIFETIME OF MORE THAN 10 YEARS CAN BE OBTAINED IF THE OPERATION VOLTAGE IS BELOW ~1.3V

US 6,207,589 B1

METHOD OF FORMING A DOPED METAL OXIDE DIELECTRIC FILM

This application is a divisional of application Ser. No. 09/356,470, filed Jul. 19, 1999, now U.S. Pat. No. 6,060,755 entitiled "Aluminum-Doped Zirconium Dielectric Film Transistor Structure and Deposition Method for Same.

BACKGROUND AND SUMMARY OF THE INVENTION

The present invention relates generally to integrated circuit (IC) fabrication processes and, more particularly, to a high dielectric constant gate insulation film, and a deposition method for such film.

Current Si VLSI technology uses $SiO_2$ as the gate dielectric in MOS devices. As device dimensions continue to scale down, the thickness of the $SiO_2$ layer must also decrease to maintain the same capacitance between the gate and channel regions. Thicknesses of less than 2 nanometers (nm) are expected in the future. However, the occurrence of high tunneling current through such thin layers of $SiO_2$ requires that alternate materials be considered. Materials with high dielectric constants would permit gate dielectric layers to be made thicker, and so alleviate the tunneling current problem. These so-called high-k dielectric films are defined herein as having a high dielectric constant relative to silicon dioxide. Typically, silicon dioxide has a dielectric constant of approximately 4, while high-k films have a dielectric constant of greater than approximately 10. Current high-k candidate materials include titanium oxide ($TiO_2$), zirconium oxide ($ZrO_2$), tantalum oxide ($Ta_2O_5$), and barium and strontium titanium oxide $(Ba,Sr)TiO_3$.

One common problem associated with the above-mentioned high-k dielectrics is that they develop a crystalline structure under normal preparation conditions. As a result, the surface of the film is very rough. Surface roughness causes non-uniform electrical fields in the channel region adjacent the dielectric film. Such films are not suitable for the gate dielectrics of MOSFET devices.

Because of high direct tunneling currents, $SiO_2$ films thinner than 1.5 nm cannot be used as the gate dielectric in CMOS devices. There are currently intense efforts in the search for the replacement of $SiO_2$, with $TiO_2$ and $Ta_2O_5$ attracting the greatest attention. However, high temperature post deposition annealing, and the formation of an interfacial $SiO_2$ layer, make achieving equivalent $SiO_2$ thicknesses (EOT) of less than 1.5 nm very difficult.

It would be advantageous if a high-k dielectric film could be used as an insulating barrier between a gate electrode and the underlying channel region in a MOS transistor.

It would be advantageous if high-k dielectric films could be formed with reduced surface roughness, crystallinity, and electrical leakage. It would be advantageous if these non-crystalline high dielectric constant materials could be used in gate dielectrics and storage capacitors of integrated circuits.

It would be advantageous if improved high-k dielectric materials could be formed by simply doping, or otherwise adding additional elements to currently existing high-k dielectric materials.

Accordingly, a thin film having a high dielectric constant (10 to 25) is provided. The film including a trivalent metal, such as aluminum (Al), scandium (Sc), or lanthanum (La), a metal selected from the group consisting of zirconium (Zr) and hafnium (Hf), and oxygen.

Typically, the percentage of trivalent metal in the film does not exceed approximately 50%, with Al at a percentage of approximately 25% being preferred.

Also provided is a MOSFET transistor. The transistor comprising a gate electrode, a channel region having a top surface underlying said gate electrode, and a gate dielectric film interposed between the gate electrode and the channel region top surface. The content of the dielectric film is as described above. Typically, the gate dielectric film has a thickness in the range of approximately 20 and 200 Å.

Some aspects of the invention further comprise the transistor having an interface barrier, with a thickness in the range of approximately 2 to 5 Å, interposed between the channel region and the gate dielectric film. The interface materials are selected from the group consisting of silicon nitride and silicon oxynitride, whereby the channel region top surface is made smoother to prevent the degradation of electron mobility of the MOSFET.

In the fabrication of an integrated circuit (IC) having a surface, a sputtering method is also provided to form a doped metal oxide film on the IC surface. The method comprises the steps of:

a) establishing an atmosphere including oxygen;

b) sputtering at least one target metal including a metal selected from the group consisting of Zr and Hf, and including a trivalent metal on the IC silicon surface;

c) in response to Steps a) and b), forming the doped metal oxide film; and d) annealing at a temperature in the range of approximately 400 and 800 degrees C, whereby a thin film having a high dielectric constant and good insulating properties is formed.

In some aspects of the invention Step a) includes co-sputtering with separate targets including a first target of a metal selected from the group consisting of Zr and Hf, and a second target including a trivalent metal.

Alternately, a chemical vapor deposition (CVD) method of depositing the doped metal oxide film is provided comprising the steps of:

a) preparing at least one precursor including a metal selected from the group consisting of Zr and Hf, and a trivalent metal;

b) vaporizing the precursor;

c) establishing an atmosphere including oxygen;

d) decomposing the precursor on the IC surface to deposit, by chemical vapor deposition (CVD), an alloy film including a metal selected from the group consisting of Zr and Hf, a trivalent metal, and oxygen; and e) annealing at a temperature in the range of approximately 400 to 800 degrees C, whereby a thin film having a high dielectric constant and good barrier properties is formed.

In yet another alternate, an evaporation deposition method of depositing the doped metal oxide film is provided comprising the steps of:

a) establishing a vacuum (gas-free) atmosphere;

b) preparing at least one crucible including a metal selected from the group consisting of Zr and Hf, and a trivalent metal;

c) heating the at least one crucible at a temperature in the range of approximately 1000 and 2000 degrees C, to evaporate the metals prepared in Step b);

d) in response to Steps a) through c), depositing an alloy film including a metal selected from the group consisting of Zr and Hf, and a trivalent metal; and e) annealing in an atmosphere including oxygen at a temperature in the range of approximately 400 to 800 degrees C, to form an alloy film with oxygen, whereby a thin film having a high dielectric constant and good barrier properties is formed.

DETAILED DESCRIPTION OF THE PREFERRED EMBODIMENT

The present invention investigates doped Zirconium oxide. Doping, preferably with AL, reduces the leakage current, and increase the crystallization temperature of the gate dielectrics. A record maximum accumulation capacitance about 28 femto-farads (fF)/$\mu m^2$, with a leakage current of less than 0.1 A/$cm^2$, has been achieved for a 3 nm Zr—Al—O film having an effective dielectric constant of 12~18. Submicron PMOSFETs have been fabricated with the Zr—Al—O gate dielectrics with excellent characteristics. In short, it was discovered that doping a $ZrO_2$ film, with a trivalent metal such as Al, results in that film remaining amorphous under typical (high temperature) processing conditions.

The present invention is a thin film having a high dielectric constant, with respect to silicon dioxide, which comprises a trivalent metal, a metal selected from the group consisting of zirconium (Zr) and hafnium (Hf), and oxygen. The high dielectric film is resistant to crystallization, remaining amorphous to form a smoother surface. The trivalent metal is selected from the group consisting of aluminum (Al), scandium (Sc), and lanthanum (La).

In useful application, the thin film typically has a thickness in the range of approximately 20 and 200 Å, a dielectric constant in the range of approximately 10 to 25.

The percentage of Al, or other trivalent metal in the film, typically does not exceed approximately 50%, with a percentage of approximately 25% being preferred.

Figure 1:
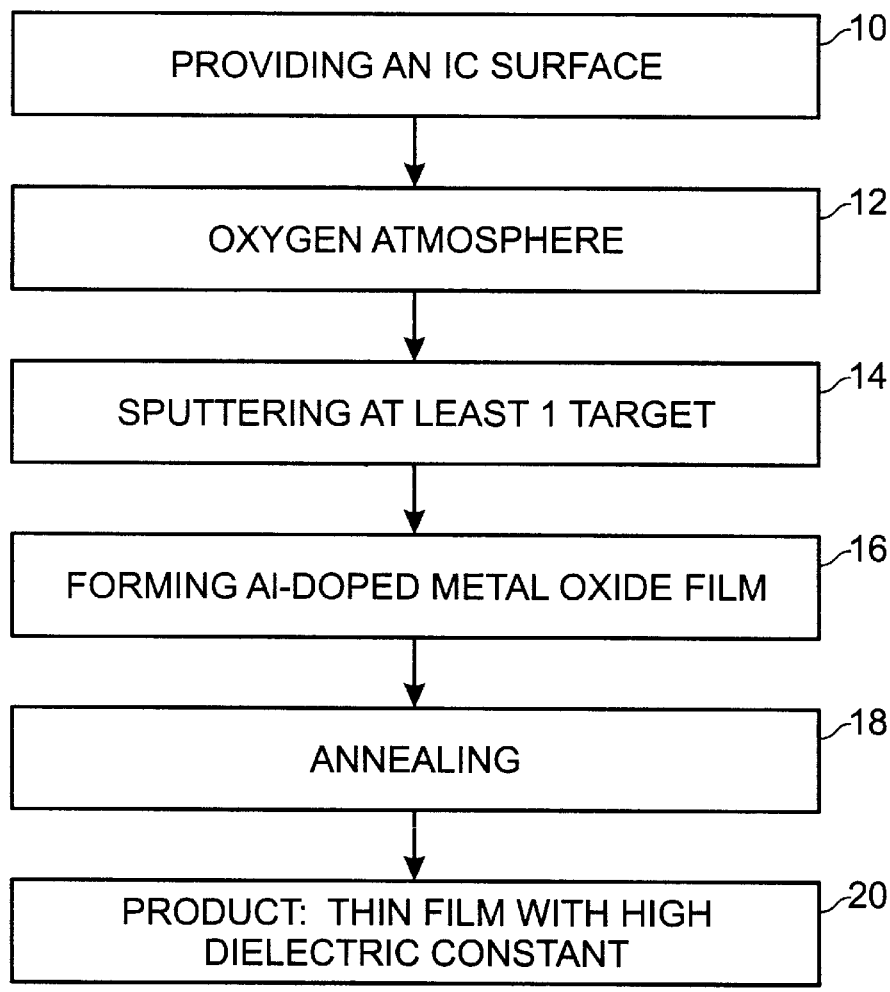
FIG. 1 is a flowchart illustrating a sputter deposition method for the doped metal oxide film of the present invention.

FIG. 1 is a flowchart illustrating a sputter deposition method for the doped metal oxide film of the present invention. Step 10 provides an integrated circuit (IC) having a surface. Step 12 establishing an atmosphere including oxygen. Typically, Step 12 includes the atmosphere also comprising argon (Ar), with the ratio of $O_2$ to Ar being in the range of approximately 5 to 25%. The pressure is in the range of approximately 1 to 10 millitorr (mT). Step 14 sputters at least one target metal including a metal selected from the group consisting of Zr and Hf on the IC surface. Step 14 also sputters a trivalent metal on the IC surface. The trivalent metal is selected from the group consisting of aluminum (Al), scandium (Sc), and lanthanum (La). In some aspects of the invention, Step 14 includes co-sputtering with separate targets including a first target of a metal selected from the group consisting of Zr and Hf, and a second target including the trivalent metal.

Step 16, in response to Steps 12 and 14, forms the doped metal oxide film. Step 18 anneals at a temperature in the range of approximately 400 and 800 degrees C. The annealing time varies in the range of approximately 10 seconds to 30 minutes, depending on the co-sputtering with separate targets including a first target of a metal selected from the group consisting of Zr and Hf, and a second target including the trivalent metal.

Step 16, in response to Steps 12 and 14, forms the doped metal oxide film. Step 18 anneals at a temperature in the range of approximately 400 and 800 degrees C. The annealing time varies in the range of approximately 10 seconds to 30 minutes, depending on the annealing temperature. Step 18 includes establishing an atmosphere including elements selected from the group consisting of Ar, $N_2$, $N_2$:$H_2$ forming gas, $O_2$, $H_2O$, $N_2O$, NO, no gas (gas-free environment), and oxygen plasma. Step 20 is a product, where a thin film having a high dielectric constant and good insulation properties is formed.

In some aspects of the invention, wherein Step 10 provides a silicon IC surface, a further step precedes Step 16. Step 14a (not shown) establishes an IC silicon surface temperature in the range of approximately room temperature and 400 degrees C.

Zr—Al—O and Hf—Al—O films were prepared by co-sputtering as described above. The sputtering power ratio was adjusted to vary the amount of Al concentration in zirconium oxide.

The following figures showed the capacitance vs. voltage (C-V), and current vs. voltage (I-V) characteristics of a 63 Å Zr—Al—O film prepared with sputtering ration of Zr=300 watts (W)/Al=60 W, in a gas mixture of $O_2$:Ar=1:5 millitorr (mT). The film was further annealed in oxygen at 500° C. for 30 seconds.

Figure 2:
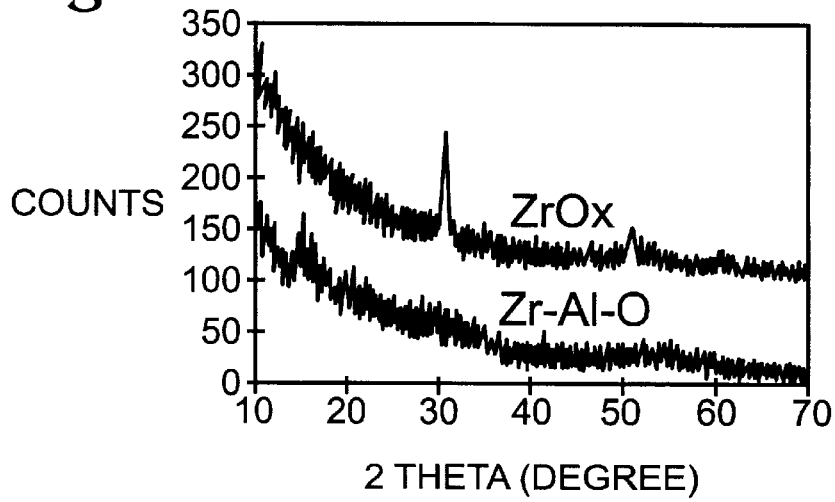
FIG. 2 illustrates an X-ray diffraction measurement comparing a $ZrO_2$ film with an Al-doped $ZrO_2$ film of the present invention.
Figure 3:
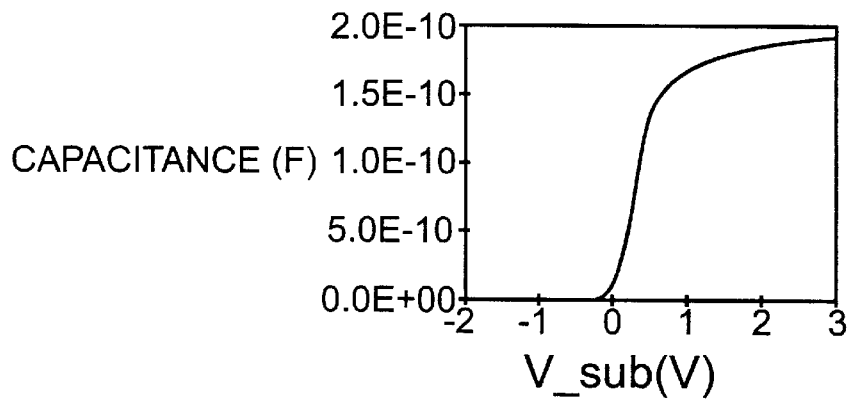
FIG. 3 illustrates the high frequency CV plot of a 63 Å Zr—Al—O film for a 100 micron ($\mu$m)×100 $\mu$m capacitor.

FIG. 2 illustrates an X-ray diffraction measurement comparing a $ZrO_2$ film with an Al-doped $ZrO_2$ film of the present was obtained from the CV measurement, which suggests that the dielectric constant is ~16 for this film.

Figure 4:
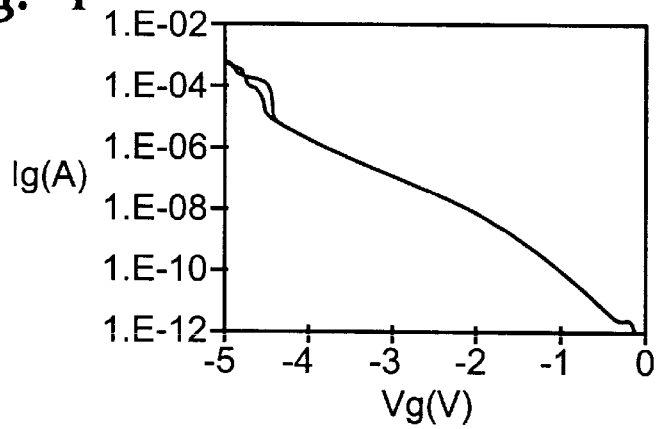
FIG. 4 is an IV plot illustrating the leakage characteristics of the above-mentioned present invention film.

FIG. 4 is an IV plot illustrating the leakage characteristics of the above-mentioned present invention film. The leakage current is only about $6\times10^{-5}$ A/$cm^2$, which is much smaller than that of the $SiO_2$ film of equivalent thickness.

Figure 5:
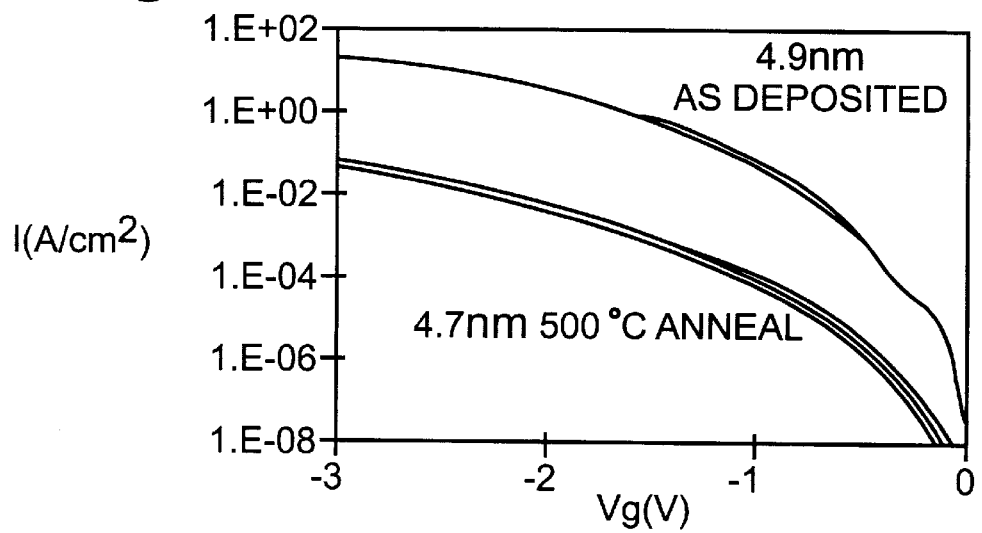
FIG. 5 illustrates leakage current characteristics following a post-deposition annealing at approximately 400 to 500° C.

Al doped $ZrO_2$ films were prepared by co-sputtering of Al and Zr targets with power ratio of 1:5 in a mixture of oxygen and Ar at room temperature. FIG. 5 illustrates leakage current characteristics following a post-deposition annealing at approximately 400 to 500° C. This temperature is drastically lower than needed for other films, such as $TiO_2$, where an anneal at more than 750° C. is usually needed to reduce the leakage current. Thickness of the film is evaluated by spectroscopic ellipsometry.

Figure 6:
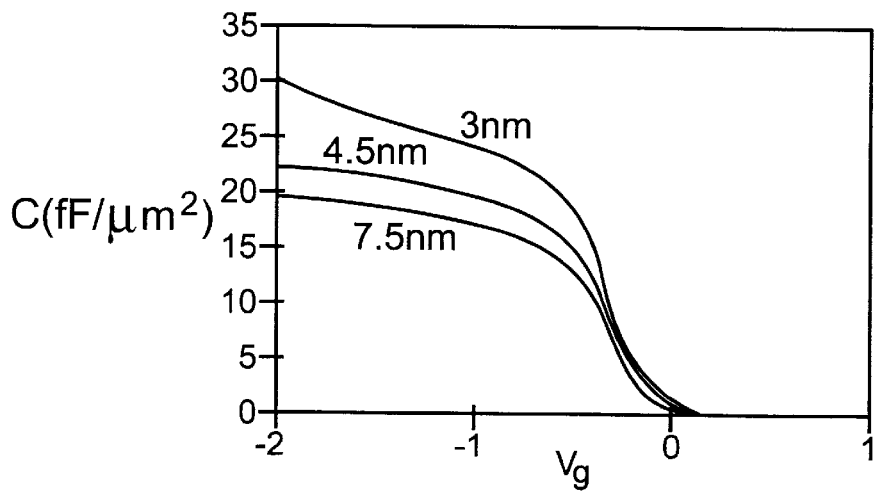
FIG. 6 illustrates the high frequency CV curves for present invention films of three different thicknesses.

FIG. 6 illustrates the high frequency CV curves for present invention films of three different thicknesses. Maximum accumulation capacitance of 26 $fF/\mu m^2$ is obtained for a 3 nm film at gate bias of −1.5V. At a higher gate bias, the gate leakage current causes the CV curve to spike up, preventing the accurate measurement of capacitance. By extrapolation it can be estimated that the capacitance is approximately 28 $fF/\mu m^2$ at gate bias of −2 V. This corresponds to a classical dielectric thickness (CDT=$SiO_2$/C) of approximately 1.2 nm. Including the quantum mechanical corrections which have been estimated to be about 0.3 nm, an EOT less than 1.0 nm is obtained.

Figure 7:
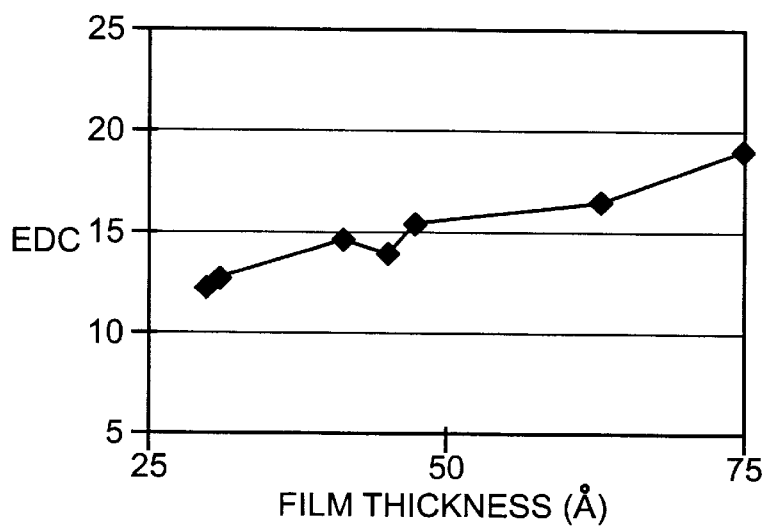
FIG. 7 illustrates a slight dependence of effective dielectric constant of the film as a function of film thickness, indicating that a minimal interfacial $SiO_2$ layer is present.

FIG. 7 illustrates a slight dependence of effective dielectric constant of the film as a function of film thickness, indicating that a minimal interfacial $SiO_2$ layer is present.

Figure 8:
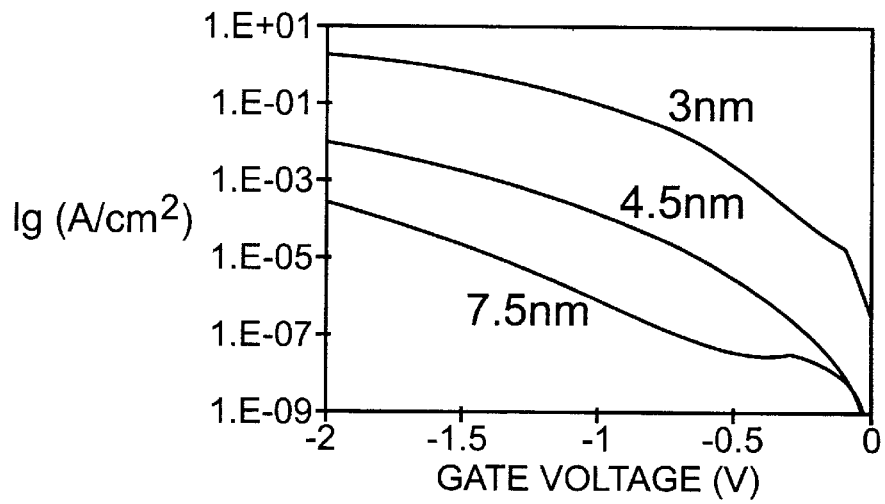
FIG. 8 illustrates the IV curves for the films of FIG. 6.

FIG. 8 illustrates the IV curves for the films of FIG. 6. For the 3 nm film, the gate leakage current is approximately 0.5 $A/cm^2$ at −1.5 V, and approximately 0.1 $A/cm^2$ at the likely operating voltage of −1 V.

Figure 9:
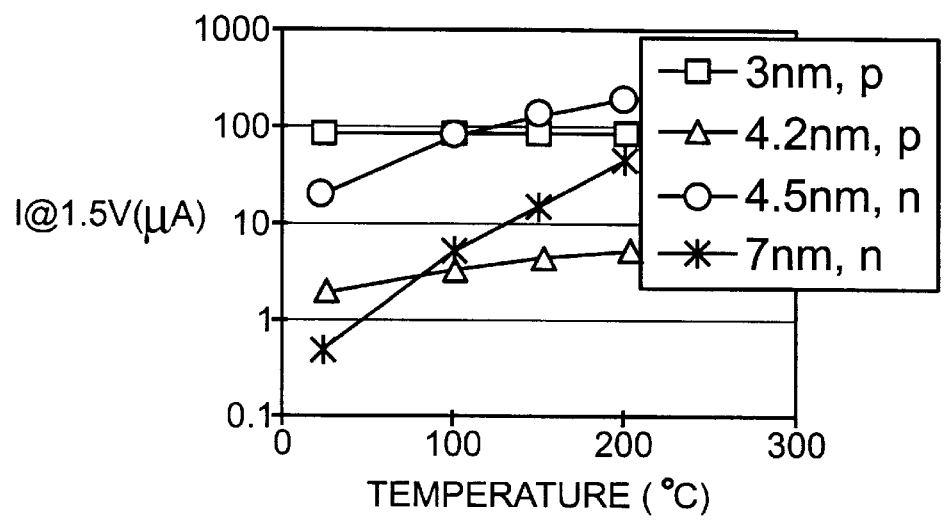
FIG. 9 illustrates that the leakage current on an n-type substrate is about 10× larger than films of similar thickness on p-type substrate.

FIG. 9 illustrates that the leakage current on an n-type substrate is about 10× larger than films of similar thickness on p-type substrate. Temperature dependence of the leakage current is also much larger. This suggests that the conduction mechanism is most likely Frenkel-Poole type and that the energy barrier for electron conduction is much smaller than for that for hole conduction. The presence of electron traps is not surprising since the dielectric films were made using sputtering techniques.

Figure 10:
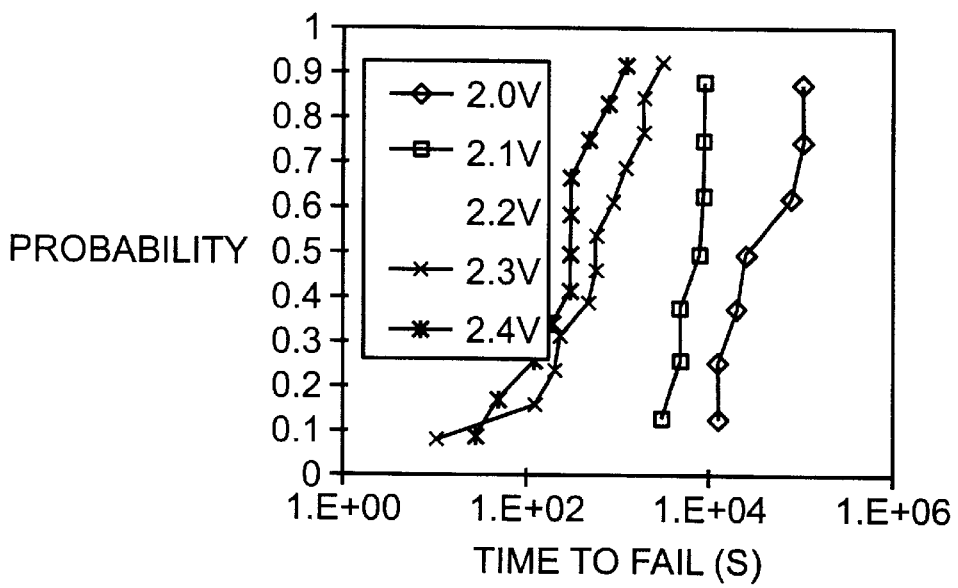
FIGS. 10 and 11 illustrate the reliability of the films of FIG. 6, despite the presence of charge traps in the film.
Figure 11:
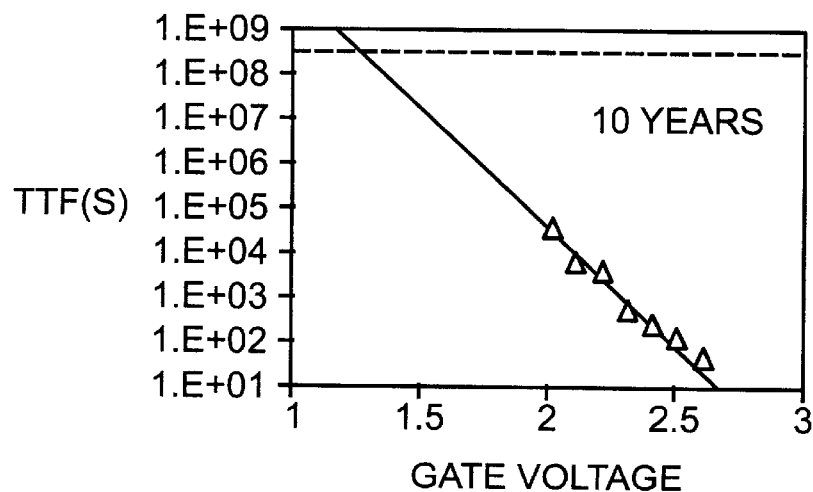

FIGS. 10 and 11 illustrate the reliability of the films of FIG. 6, despite the presence of charge traps in the film. The time dependent dielectric breakdown (TDDB) lifetime can be extrapolated to be more than 10 years at below approximately 1.3 V operation.

PMOS transistors having the Zr—Al—O gate dielectrics were processed using a nitride gate replacement process where the lightly doped drain (LDD) and source/drain regions are formed before the final gate stack is in place. The thickness of the Zr—Al—O gate dielectrics is about 6 nm with a $C_{max}$ measured at accumulation of more than 20 $fF/\mu m^2$.

The same general characteristics gleaned from the study of the present invention capacitor film are applicable to gate dielectrics, storage capacitors, and other applications such as one transistor (1T) ferroelectric memory.

Figure 12:
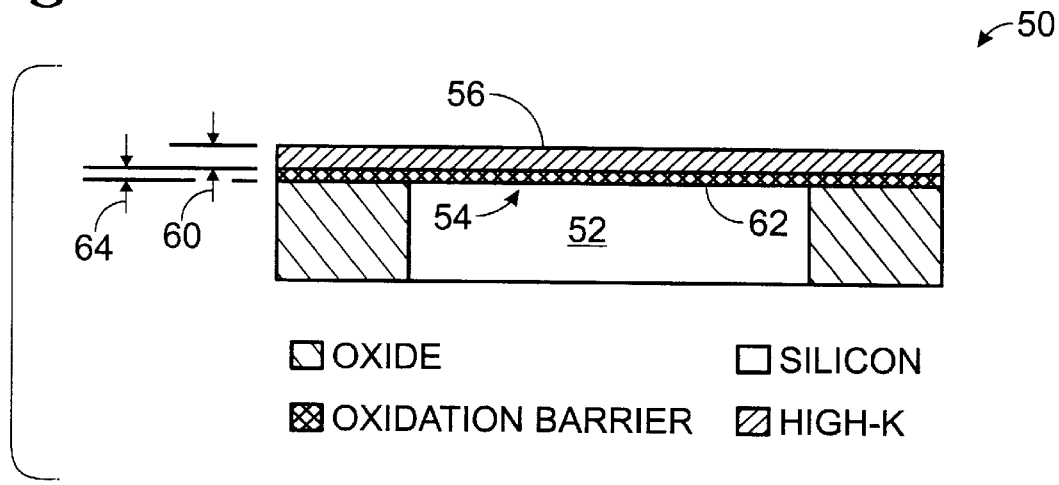
FIGS. 12 and 13 illustrate steps in a completed transistor made using the present invention doped metal oxide film.
Figure 13:
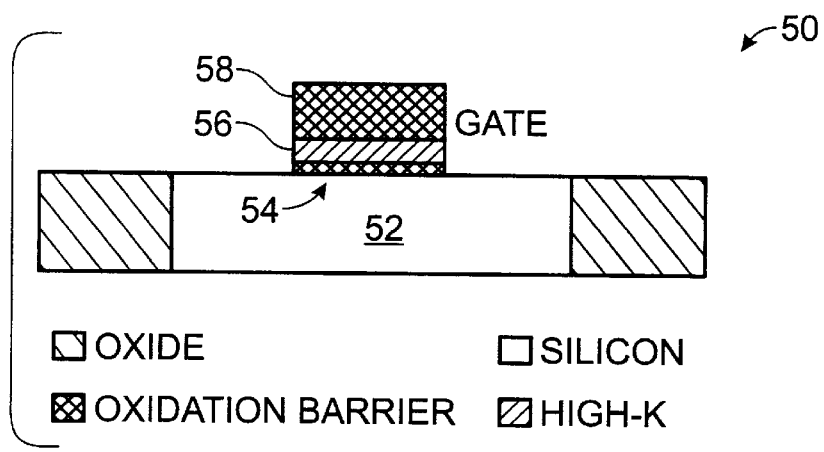

FIGS. 12 and 13 illustrate steps in a completed MOSFET transistor made using the present invention doped metal oxide film. FIG. 12 illustrates transistor 50 having a channel region 52 with a top surface 54. Overlying channel region 52 is a gate dielectric film 56.

FIG. 13 illustrates gate dielectric film 56 interposed between gate electrode 58 and channel region top surface 54. Gate dielectric film 56 has a high dielectric constant relative to silicon dioxide, and includes a metal selected from the group consisting of zirconium (Zr) and hafnium (Hf), and oxygen. Gate dielectric film 56 includes a trivalent metal selected from the group consisting of aluminum (Al), scandium (Sc), and lanthanum (La).

The percentage of Al, or other trivalent metal, in film 56 is in the range of approximately 0 to 50%. Preferably, the percentage of Al in film 56 is approximately 25%. Gate dielectric film 56 has a thickness 60 (FIG. 13) in the range of approximately 20 and 200 Å. Gate dielectric film 56 has a dielectric constant in the range of approximately 10 to 25.

In some aspects of the invention, transistor 50 further comprises an interface barrier 62 having a thickness 64 in the range of approximately 2 to 5 Å, interposed between channel region 52 and gate dielectric film 56. Interface barrier 62 is comprised of materials selected from the group consisting of silicon nitride and silicon oxynitride, whereby channel region top surface 54 is made smoother to increase the electron mobility of MOSFET 50.

In the case of gate dielectrics in bulk CMOS device applications, the wafers are processed using any state of the art conventional method, such as isolation, followed by P-well and N-well formation to expose the channel region. An ultra-thin layer of oxidation barrier may still be needed. In this case, possible barriers include silicon nitride and silicon oxynitride. Next, the high-k dielectrics is deposited. There are several ways of preparing the film:

A. Co-sputtering of Zr and Al in inert or oxidizing ambient;

B. Co-sputtering compound targets, such as Zr—Al, in inert or oxidizing ambient;

C. Chemical vapor deposition of Zr—Al—O and Hf—Al—O; or

D. Evaporation.

Following deposition, the film is annealed in inert (e.g., Ar, $N_2$, $N_2$:$H_2$ forming gas) and/or oxidizing ($O_2$, $H_2O$, $N_2O$, NO, and no gases (gas-free) ambient atmosphere at an elevated temperature (400–900° C.) to condition the high k-film and the high-k/Si interface. However, if the film is deposited by evaporation, the annealing process typically includes oxygen, to include oxygen in the alloy film.

Following annealing, a gate is deposited and patterned into a gate stack. The gate material could be metal or polysilicon. Then, using any state of the art device fabrication process, the device is completed by the conventional method, or a gate replacement method using nitride, polysilicon, or poly SiGe dummy gate.

Figure 14:
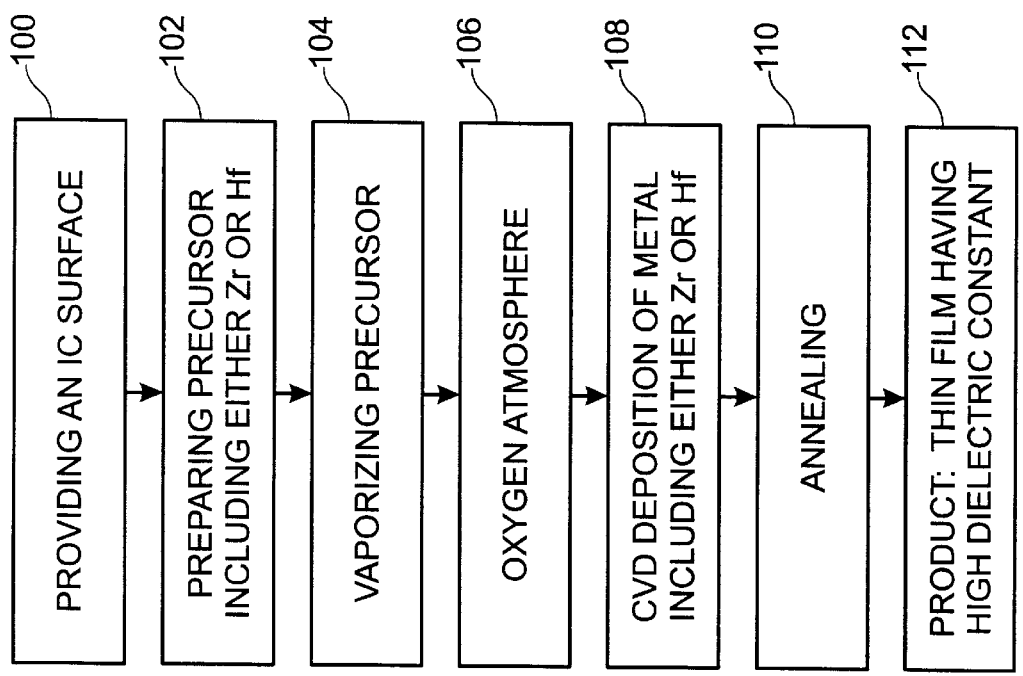
FIG. 14 is a flowchart illustrating steps in a CVD method of forming an Al-doped metal oxide film of the present invention.

FIG. 14 is a flowchart illustrating steps in a CVD method of forming a doped metal oxide film of the present invention. Step 100 provides an integrated circuit (IC) having a surface. Step 102 prepares at least one precursor including a metal selected from the group consisting of Zr and Hf, and a trivalent metal. Step 102 includes a trivalent metal selected from the group consisting of aluminum (Al), scandium (Sc), and lanthanum (La). In some aspects of the invention, Step 102 comprises a first precursor including a metal selected from the group consisting of Zr and Hf, and a second precursor including a trivalent metal. Step 104 vaporizes the at least one precursor. Step 106 establishes an atmosphere including oxygen. Typically, Step 106 includes the atmosphere comprising argon (Ar), with the ratio of $O_2$ to Ar being in the range of approximately 5 to 25%, and the pressure being in the range of approximately 1 to 10 T. Step 108 decomposes the precursor on the IC surface to deposit, by chemical vapor deposition (CVD), an alloy film including a metal selected from the group consisting of Zr and Hf, a trivalent metal, and oxygen.

Step 110 anneals at a temperature in the range of approximately 400 to 800 degrees C. Step 110 includes establishing an atmosphere including elements selected from the group consisting of Ar, $N_2$, $N_2$:$H_2$ forming gas, $O_2$, $H_2O$, $N_2O$, NO, no gas, and oxygen plasma. Step 112 is a product, where a thin film having a high dielectric constant and good barrier properties is formed.

In some aspects of the invention, Step 100 provides a silicon IC surface, and a further step precedes Step 108. Step 106a establishes an IC silicon surface temperature in the range of approximately 300 and 500 degrees C.

Figure 15:
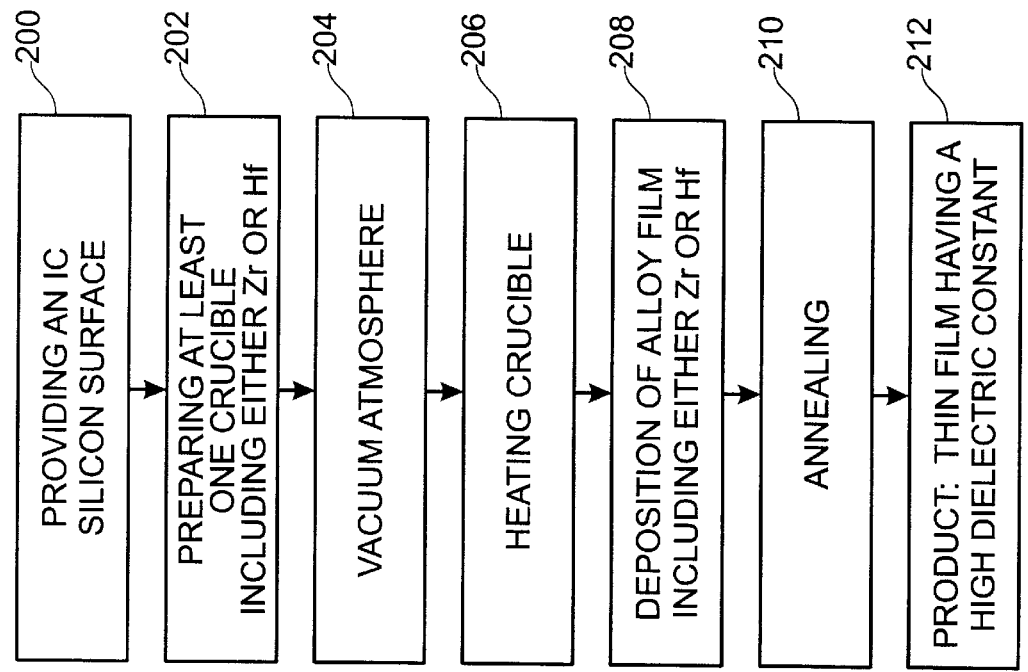
FIG. 15 is a flowchart illustrating steps in an evaporation method of forming a doped metal oxide film.

FIG. 15 is a flowchart illustrating steps in an evaporation method of forming a doped metal oxide film. Step 200 provides an integrated circuit (IC) having a silicon surface. Step 202 prepares at least one crucible including a metal selected from the group consisting of Zr and Hf, and a trivalent metal. Step 202 includes a trivalent metal selected from the group consisting of aluminum (Al), scandium (Sc), and lanthanum (La). Step 204 establishes a vacuum (gas-free) atmosphere. Step 206 heats the at least one crucible to a crucible temperature in the range of approximately 1000 and 2000 degrees C, to evaporate the metals prepared in Step 202. Step 208, in response to Steps 202 through 206, deposits an alloy film including a metal selected from the group consisting of Zr and Hf, and a trivalent metal. Step 210 anneals in an atmosphere including oxygen at a temperature in the range of approximately 400 to 800 degrees C to form an alloy film including a metal selected from the group consisting of Zr and Hf, a trivalent metal, and oxygen. Step 210 includes establishing an atmosphere including elements selected from the group consisting of Ar, $N_2$, $N_2$:$H_2$ forming gas, $O_2$, $H_2O$, $N_2O$, NO, no gas, and oxygen plasma. Step 212 is a product, where a thin film having a high dielectric constant and good barrier properties is formed.

In some aspects of the invention, Step 202 includes a first crucible for the metal selected from the group of Zr and Hf, and a second crucible for the trivalent metal. Then, Step 206 includes heating the first crucible to a temperature in the range of approximately 1000 and 2000 degrees C, and heating the second crucible to a temperature in the range of approximately 1000 and 2000 degrees C. The Zr/Hf crucible need not be the same temperature as the trivalent metal crucible.

In some aspects of the invention, Step 210 includes sub-steps (not shown). Step 210a anneals in an atmosphere including oxygen at a temperature in the range of approximately 400 and 800 degrees C. Step 210b anneals in an atmosphere including elements selected from the group consisting of Ar, $N_2$, $N_2$:$H_2$ forming gas, $O_2$, $H_2O$, $N_2O$, NO, no gas, and oxygen plasma, at a temperature in the range of approximately 400 and 800 degrees C.

A high-k dielectric film has been disclosed which remains amorphous at relatively high annealing temperatures. Because the film does not form a crystalline structure, interfaces to adjacent films have fewer irregularities. When used as a gate dielectric, the film can be made thick enough to provide the capacitance required to couple the gate electric field into the channel regions, while the surface of the channel region can be made smooth to support high electron mobility. The film is formed through CVD, sputtering, or evaporation deposition methods. Other variations and embodiments of the present invention will likely occur to others skilled in the art.

What is claimed is:

1. In the fabrication of an integrated circuit (IC) having a surface, a method of forming a doped metal oxide film on the IC surface comprising the steps of:
   a) establishing an atmosphere including oxygen;
   b) sputtering at least one target metal including a metal selected from the group consisting of Zr and Hf, and including a trivalent metal on the IC silicon surface;
   c) in response to Steps a) and b), forming the doped metal oxide film; and
   d) annealing at a temperature in the range of approximately 400 and 800 degrees C, whereby a thin film having a high dielectric constant and good barrier properties is formed.

2. The method as in claim 1 wherein a silicon IC surface is provided, and comprising a further step, preceding Step c), of:
   $b_1$) establishing an IC silicon surface temperature in the range of approximately room temperature and 400 degrees C.

3. The method as in claim 1 in which Step a) includes the atmosphere including argon (Ar), in which the ratio of $O_2$ to Ar is in the range of approximately 5 to 25%, and in which the pressure is in the range of approximately 1 to 10 millitorr (mT).

4. The method as in claim 1 in which Step d) includes establishing an atmosphere including elements selected from the group consisting of Ar, $N_2$, $N_2$:$H_2$ forming gas, $O_2$, $H_2O$, $N_2O$, NO, no gas, and oxygen plasma.

5. The method as in claim 1 in which Step b) includes a trivalent metal selected from the group consisting of aluminum (Al), scandium (Sc), and lanthanum (La).

6. The method as in claim 1 in which Step b) includes co-sputtering with separate targets including a first target of a metal selected from the group consisting of Zr and Hf, and a second target including a trivalent metal.

7. In the fabrication of an integrated circuit (IC) having a surface, a method of forming a doped metal oxide film comprising the steps of:
   a) preparing at least one precursor including a metal selected from the group consisting of Zr and Hf, and a trivalent metal;
   b) vaporizing the at least one precursor;
   c) establishing an atmosphere including oxygen;
   d) decomposing the precursor on the IC surface to deposit, by chemical vapor deposition (CVD), an alloy film including a metal selected from the group consisting of Zr and Hf, a trivalent metal, and oxygen; and
   e) annealing at a temperature in the range of approximately 400 to 800 degrees C, whereby a thin film having a high dielectric constant and good barrier properties is formed.

8. The method as in claim 7 wherein a silicon IC surface is provided, and comprising the further step, preceding Step d), of:
   $c_1$) establishing an IC silicon surface temperature in the range of approximately 300 and 500 degrees C.

9. The method as in claim 7 in which Step c) includes the atmosphere including argon (Ar), in which the ratio of $O_2$ to Ar is in the range of approximately 5 to 25%, and in which the pressure is in the range of approximately 1 to 10 torr (T).

10. The method as in claim 7 in which Step e) includes establishing an atmosphere including elements selected from the group consisting of Ar, $N_2$, $N_2$:$H_2$ forming gas, $O_2$, $H_2O$, $N_2O$, NO, no gas, and oxygen plasma.

11. The method as in claim 7 in which Step a) includes a trivalent metal selected from the group consisting of aluminum (Al), scandium (Sc), and lanthanum (La).

12. The method as in claim 7 in which Step a) comprises a first precursor including a metal selected from the group consisting of Zr and Hf, and in which Step a) comprises a second precursor including a trivalent metal.

13. In the fabrication of an integrated circuit (IC) having a silicon surface, a method of forming a doped metal oxide film comprising the steps of:
   a) preparing at least one crucible including a metal selected from the group consisting of Zr and Hf, and a trivalent metal;

b) establishing a vacuum atmosphere;

c) heating the at least one crucible to a crucible temperature in the range of approximately 1000 and 2000 degrees C, to evaporate the metals prepared in Step a);

d) in response to Steps a) through c), depositing an alloy film including a metal selected from the group consisting of Zr and Hf, and a trivalent metal; and e) annealing in an atmosphere including oxygen at a temperature in the range of approximately 400 to 800 degrees C to form an alloy film including a metal selected from the group consisting of Zr and Hf, a trivalent metal, and oxygen, whereby a thin film having a high dielectric constant and good barrier properties is formed.

14. The method as in claim 13 in which Step a) includes a first crucible for the metal selected from the group of Zr and Hf, and a second crucible for the trivalent metal, and in which Step c) includes heating the first crucible to a temperature in the range of approximately 1000 and 2000 degrees C, and heating the second crucible to a temperature in the range of approximately 1000 and 2000 degrees C.

15. The method as in claim 13 in which Step e) includes establishing an atmosphere including elements selected from the group consisting of Ar, $N_2$, $N_2$:$H_2$ forming gas, $O_2$, $H_2O$, $N_2O$, NO, no gas, and oxygen plasma.

16. The method as in claim 15 in which Step e) includes sub-steps as follows:

$e_1$) annealing in an atmosphere including oxygen at a temperature in the range of approximately 400 and 800 degrees C; and $e_1$) annealing in an atmosphere including elements selected from the group consisting of Ar, $N_2$, $N_2$:$H_2$ forming gas, $O_2$, $H_2O$, $N_2O$, NO, no gas, and oxygen plasma, at a temperature in the range of approximately 400 and 800 degrees C.

17. The method as in claim 13 in which Step a) includes a trivalent metal selected from the group consisting of aluminum (Al), scandium (Sc), and lanthanum (La).

* * * * *